United States Patent [19]

Egitto et al.

[11] Patent Number: 4,654,115

[45] Date of Patent: Mar. 31, 1987

[54] PROCESS FOR REMOVING CONTAMINANT

[75] Inventors: Frank D. Egitto; Francis Emmi, both of Binghamton; Walter E. Mlynko, Vestal; Robin A. Susko, Owego, all of N.Y.

[73] Assignee: International Business Machines Corporation, Armonk, N.Y.

[21] Appl. No.: 849,247

[22] Filed: Apr. 8, 1986

[51] Int. Cl.⁴ .................... B44C 1/22; B29C 37/00; C03C 15/00; C03C 25/06
[52] U.S. Cl. ........................................ 156/643; 134/1; 134/22.1; 156/644; 156/646; 156/651; 156/655; 156/659.1; 156/668; 156/902
[58] Field of Search ............... 156/643, 644, 646, 651, 156/654, 655, 659.1, 668, 902; 134/1, 22.1; 252/79.1

[56] References Cited

U.S. PATENT DOCUMENTS

| | | | |
|---|---|---|---|
| 4,328,081 | 5/1982 | Fazlin | 156/345 X |
| 4,351,697 | 9/1982 | Shanefield et al. | 156/643 |
| 4,496,420 | 1/1985 | Frohlich et al. | 156/668 X |
| 4,582,564 | 4/1986 | Shanefield et al. | 156/668 X |
| 4,599,134 | 7/1986 | Babu et al. | 156/644 X |

Primary Examiner—William A. Powell
Attorney, Agent, or Firm—Pollock, Vande Sande & Priddy

[57] ABSTRACT

Contaminant is removed from holes by etching in a gaseous plasma by first removing contaminant from the vicinity of the edges of the hole. Next, a mask is provided in the vicinity of the edges to prevent etching by contacting with a gaseous plasma which is different from the gaseous plasma employed in the first etching step. The holes are then etched in a gaseous plasma to remove contaminant from the interior of the holes in the vicinity of the center of the holes, whereby the mask protects the edges from being etched.

11 Claims, 1 Drawing Figure

PROCESS FOR REMOVING CONTAMINANT

TECHNICAL FIELD

The present invention is concerned with removing contaminant from holes and particularly from holes provided in circuit boards and circuit cards. The present invention is especially concerned with removing contaminant by subjecting the article to a gaseous plasma. The present invention provides for uniformly removing contaminant without over-etching the outer edges of the hole.

BACKGROUND ART

In the manufacture of printed circuit cards and boards, a dielectric sheet material is employed as a substrate. A conductive circuit pattern is provided on one or both of the major surfaces of the substrate. In order to provide electrical connection between layers, holes referred to as "through-holes" are provided in the circuit boards and cards and such are subsequently plated with an electrically conductive coating such as copper.

However, in the process for producing the holes, invariably some amount of contaminant is formed within and around the edges of the holes.

For instance, when drilling a dielectric substrate such as obtained from an epoxy material, what is commonly referred to as "epoxy smear" due to the drilling results within the hole and around the edges of the hole.

Accordingly, prior to electrically plating the holes, the contaminant must be removed to as great an extent as possible. Various treatments have been suggested for removing such contaminant including subjecting the substrate to a gaseous plasma. However, it has been observed that while many gaseous plasma systems are effective for removing the contaminant within the vicinity of the edges of the holes that such are much less effective in removing contaminant from the interior of the holes and particularly within the vicinity of the center of the holes. However, if the etching process is continued for sufficient time in order to remove substantial contaminant from the interior of the holes, then the outer edges of the holes due to the additional etching time become over-etched. These problems are particularly pronounced when dealing with holes having a relatively high aspect ratio. The aspect ratio is the depth of the hole relative to its diameter.

SUMMARY OF INVENTION

The present invention is concerned with a process for removing contaminant from holes. The process includes etching the holes in a gaseous plasma to remove contaminant from the vicinity of the edges of the holes. The gaseous plasma is formed from oxygen and a fluorinated compound with the relative amounts of the oxygen and fluorinated compound being selected so as to remove contaminant from the vicinity of the edges of the holes.

Next, an etchant mask is provided to prevent etching within the vicinity of the edges of the holes, but not within the vicinity of the center of the holes. The mask is provided by providing a gaseous plasma which is different from the gaseous plasma employed in the etching step above and is obtained from a fluorinated compound. The amount of the fluorinated compound is selected so that such will form an gaseous plasma mask in the vicinity of the edges of the hole.

The holes are then etched in a gaseous plasma in order to remove contaminant from the vicinity of the interior of the center of the holes. The mask protects the vicinity of the edges from being etched. The gaseous plasma is formed form oxygen and a fluorinated compound wherein the relative amounts of the oxygen and fluorinated compound are selected so as to cause etching in the vicinity of the interior of the center of the holes. The gaseous plasma is different from the gaseous plasma employed to provide the mask.

SUMMARY OF DRAWING

The FIGURE is a schematic diagram of a through hole.

BEST AND VARIOUS MODES FOR CARRYING OUT INVENTION

Figure 1:
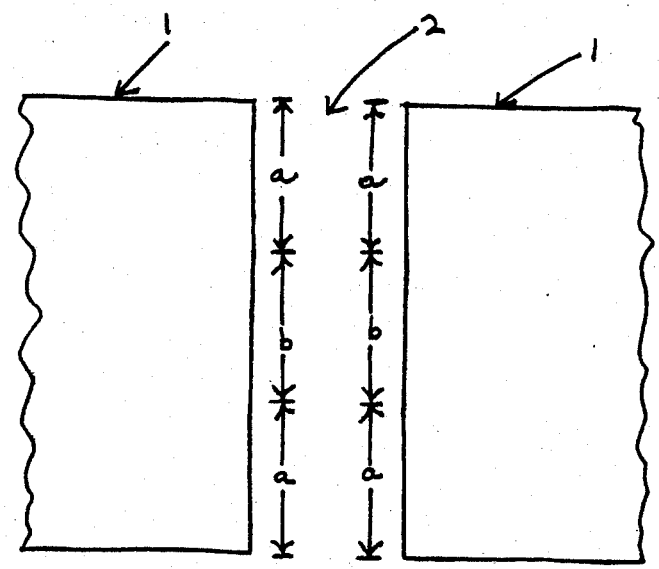

The process of the present invention is concerned with removing contaminant from holes and is especially concerned with removing contaminant from holes provided in dielectric substrates; particularly those employed for use in electronic circuit boards and circuit cards.

Holes in various dielectric substrates including thermoplastic and thermosetting resins may be treated pursuant to the present invention.

Typical thermosetting polymeric materials include epoxy, phenolic-based materials, polyimides, and polyamides. The dielectric material may be molded articles of the polymers containing fillers and/or reinforcing agents such as glass-filled epoxy or phenolic-based materials. Examples of some phenolic-type materials include copolymers of phenol, resorcinol, and cresol. Examples of some suitable thermoplastic polymeric materials include polyolefins such as polypropylene, polysulfones, polycarbonates, nitrile rubbers, and ABS polymers.

Typical epoxy resins include the bisphenol A type resins obtained from bisphenol A and epichlorohydrin, resinous materials obtained by the epoxidation of novolak resins produced from a phenolic material such as phenol and an aldehyde such as formaldehyde with epichlorohydrin, polyfunctional epoxy resins such as tetraglycidyldiaminodiphenyl methane, and alicyclic epoxy resins such as bis(3,4-epoxy-6-methylcyclohexamethyl) adipate. The most preferred epoxy employed is of the bisphenol A type.

Also, the resinous epoxy compositions can contain accelerating agents and curing agents, as well-known in the art. Examples of suitable curing agents include polyamines, primary, secondary, and tertiary amines, polyamides, polysulfones, urea-phenol-formaldehyde, and acids or anhydrides thereof. In addition, suitable curing agents include Lewis acid catalysts such as $BF_3$ and complexes thereof.

The dielectric substrate usually contains fillers and/or reinforcing fibers such as glass fibers. Such compositions containing fibers are usually prepared by impregnating the fibers with the epoxy composition. The amount of the epoxy composition when combined with the fibers is usually about 30% to about 70% by weight and preferably about 55% to about 65% by weight of the total of the solids content of the epoxy composition and the fiberglass.

After combining with the reinforcing fibers, the composition is cured to the B-stage and molded to the desired shape, such as a sheet. When sheets are employed, the thickness is usually about 1.5 mils to about 8 mils and preferably about 2 mils to about 3 mils. The curing to the B-stage is generally achieved by using temperatures of about 80° C. to about 110° C. and for times of about 3 minutes to about 10 minutes.

The substrate can then be laminated onto another supporting substrate as is generally practiced. For instance, the bonding of substrates can be carried out by pressing together a number of sheets of the substrate in a preheated laminating press at a predetermined pressure and temperature as, for example, about 200 psi to about 500 psi and preferably about 250 psi to about 300 psi and at about 180° C. The time of the pressing operation is variable, depending upon the particular materials employed and the pressures applied. About 1 hour is adequate for the above conditions.

The through-holes are provided in the dielectric substrate and must be subsequently provided with an electrical conductor such as copper in order to provide electrical connection between circuits on opposing surfaces of the dielectric substrate. These throughholes can be provided by mechanical operations such as drilling and punching or by processing, such as by use of a laser. However, the formation of the holes results in contaminant present in the interior of the holes and around the vicinity of the edges of the hole which is generally referred to as "smear". A large portion of this contaminant is from the dielectric material in the substrate; for instance, when the dielectric is an epoxy, the contaminant is predominantly epoxy smear.

It is essential for reliable plating of the throughholes to remove as much of the contaminant as possible. This is accomplished in accordance with the present invention by etching away the contaminant in the sequence of steps required by the present invention.

The contaminant is removed from the vicinity of the edges of the hole by etching in a gaseous plasma. The gaseous plasma is formed from an oxygen-containing gas and a fluorinated compound. The relative amounts of the oxygen-containing gas and the fluorinated compound are selected so as to remove contaminant from the vicinity of the edges. However, it has been noted that although the gaseous plasma is capable of removing contaminant from the vicinity of the edges of the holes, that such does not adequately remove contaminant from the interior of the hole in the vicinity of the center of the hole. This is especially noticeable when the aspect ratio of the hole is relatively high such as at least about 3:1 and generally at least about 9:1.

However, if the etching is carried out sufficiently long enough to remove contaminant in sufficient amount from the interior of the hole in the vicinity of the center thereof, then the holes become over-etched in the vicinity of the outer edges of the hole. Over-etching, in turn, can result in reduction in insulation resistance which can lead to shorting between electrically conductive areas, and/or to plating voids, and/or to material being trapped in the subsequent plating, and/or problems concerning pin insertion contacts.

Preferred oxygen-containing gas employed is oxygen per se. Suitable fluorinated compounds include $CF_4$, $C_2F_6$, $CFCl_3$, $CF_3Cl$, $SF_6$, $CCl_2F_2$, and $NF_3$ with the most preferred fluorinated compound being $CF_4$.

The relative amounts of the oxygen-containing gas and the fluorinated compound will depend upon the specific fluorinated compound employed and the particular dielectric substrate material. However, the amounts can be readily determined without undue experimentation by merely determining the maximum etch rates as a function of different gas-feed compositions. Once this is determined for a particular set of conditions, the ranges can then be employed as discussed hereinbelow.

For instance, with $CF_4$ as the fluorinated compound, mole ratios of $O_2$ to $CF_4$ of 60 to 90:40 to 10 are suitable for an epoxy dielectric substrate for this etching step. The preferred ratio is about 70:30 of oxygen/$CF_4$. On the other hand, in the same system employing $SF_6$ as the fluorinated compound, the ratio of oxygen/$SF_6$ is about 95 to 80/5 to 20.

This etching step of the process is usually completed within about 1 minute to about 40 minutes and preferably about 10–25 minutes and is generally carried out from about room temperature to less than the degradation temperature of the dielectric substrate. The gas residence time is usually about 1 second to about 5 minutes and preferably about 1 second to about 1 minute.

The pressure employed is generally about 100 millitorr to about 500 millitorr. Typical power levels are about 0.05 watts to about 2 watts per square centimeter of one major surface of the dielectric substrate being treated.

This etching step removes contaminant from the interior of the holes which is remote from the center of the hole, but is within the vicinity of the edges of the hole. Usually this etching step removes contaminant located along about 10% to about 40% and preferably about ⅓ of the length of the hole as measured from each outer edge of the hole; these distances being presented by the letter "a" in the above FIGURE. In the FIGURE, numeral 1 represents the substrate and numeral 2 represents the hole.

After the contaminant is removed from the edges of the holes, an etchant mask is provided to prevent etching within the vicinity of the edges. This mask, however, is such as not to prevent etching in the interior of the holes within the vicinity of the center of the holes. This mask is provided by employing a gaseous plasma which differs from the gaseous plasma employed in the above-discussed etching step.

The gaseous plasma is obtained from a fluorinated compound such as $CF_4$, $C_2F_6$, $CFCl_3$, $CF_3Cl$, $SF_6$, $NF_3$, and $CCl_2F_2$. The preferred fluorinated compound is $CF_4$. This step of providing the mask can be obtained by employing the fluorinated compound, per se, or by admixing such with an oxygen-containing gas such as oxygen. However, the relative amounts of the fluorinated compound and oxygen-containing gas must be selected so as to form a mask in the vicinity of the edges of the holes without forming a mask against etching within the interior of the holes in the vicinity of the center thereof. This step does provide a mask within the interior of the holes in those areas remote from the center of the holes, but within the vicinity of the edges of the hole. In other words, the mask is provided in those locations where the prior etching step removed the contaminant. Usually this step provides the mask along about 10% to about 40% and preferably about ⅓ of the length of the hole as measured from each outer edge of the hole; these distances being presented by the letter "a" in the FIGURE.

In a typical example, employing $CF_4$ as the fluorinated gas, about 55 to about 100 mole percent of the gas should be $CF_4$ when the substrate is an epoxy material.

The step of subjecting the substrate to a gaseous plasma of this type results in the in situ formation of a mask within the vicinity of the edges of the holes without forming a mask sufficient to prevent etching within the interior of the holes within the vicinity of the center thereof. This step usually is carried out in about 1 minutes to about 20 minutes and preferably 5-15 minutes, but if desired to assure sufficient mask formation, can be carried out for much longer. The residence time of the gas is generally about 1 second to about 5 minutes and preferably about 1 second to about 60 seconds.

The pressure employed is about 100 millitorr to about 500 millitorr and the power typically is about 0.05 watts to about 2 watts per square centimeter of one surface of the dielectric substrate being treated.

The article having the mask within the vicinity of the edges of the hole is then subjected to another etching in a gaseous plasma in order to remove contaminant from the interior of the hole in the vicinity of the center of the hole. Usually this step removes contaminant from about 20% to 80% and preferably about ⅔ of the length of the hole starting at the center of the hole; these distances are represented by the letter "b" in the FIGURE.

Since the edges of the hole are protected by the in situ generated mask from being etched in the gaseous plasma, the interior of the holes within the vicinity of the center thereof can be subjected to the etching conditions for sufficient amount of time to remove the amount of contaminant normally encountered. The gaseous plasma employed can be the same as that utilized in the initial etching step for removing contaminant from within the vicinity of the edges of the holes. However, since such can be carried out for a longer period of time, it is now possible to sufficiently remove contaminant from the interior of the holes without over-etching the edges of the holes. This step of the process is usually carried out for about 1 minute to about 50 minutes and preferably 30-40 minutes, whereby the total etching time of the two etching steps is generally about 20 minutes to about 60 minutes.

After the completion of this etching step, the mask, if desired, can be removed such as by a slow etch of the mask by a high oxygen plasma or by exposing the sample to ion bombardment in a plasma system. The mask can also be removed by exposure to high relative humidity as discussed in IBM® Technical Disclosure Bulletin, Vol. 27, No. 10B, March 1985, page 5994, Egitto, et al., "Removal of Fluorination from Plasma-Modified Surfaces", disclosure of which is incorporated herein by reference. Moreover, the mask can be removed by a typical preclean operation prior to normal wet external plating operations. Also, if desired, the mask can be maintained in place without interfering with future board processing or reliability.

Plasma reactors suitable for carrying out the process of the present invention are commercially available and need not be discussed herein in any detail. Typical commercially available plasma reactors suitable for carrying out the present invention are Branson IPC-Parallel Plate Reactor Model 74-15; in-line plasma system available from Koksai, Applied Plasma System's plasma reactor; and Technics' plasma reactor.

The following non-limiting examples are presented to further illustrate the present invention.

Place an epoxy-glass fiber dielectric having through holes with an aspect ratio of about 9:1 drilled therein in a plasma generating apparatus and subject it to a gas plasma obtained from about 70 mole percent oxygen and about 30 mole percent $CF_4$ to etch the epoxy contaminant from on and around the outer edges in the holes. Conduct the etching for about 15 minutes at about 110°-125° C.. Use a gas flow rate of about 1 standard liter per minute, a gas residence time of about 19 seconds, and a pressure of about 160 millitorr with a power of about 0.07 watts/square centimeter of one side of the substrate.

Next, introduce into the gas plasma reactor a gas containing about 60 mole percent $CF_4$ and about 40 mole percent of $O_2$. Contact it with the sample for about 15 minutes at a substrate temperature of about room temperature and under the same conditions as the etching step above. This step provides a mask within the vicinity of the edges of the holes and those areas near the edges of the holes in the interior thereof which are etched in the first step.

Next, etch the interior of the holes within the vicinity of the center of the holes by employing the same conditions as in the initial etching step, except employ such for about 35 minutes.

Having thus described our invention, what we claim as new and desire to secure by Letters Patent is:

1. A process for removing contaminant from holes which comprises:
  (a) etching said holes in a gaseous plasma to remove contaminant from the vicinity of the edges of the hole wherein said gaseous plasma is formed from oxygen and a fluorinated compound and wherein the relative amounts of oxygen and said fluorinated compound are selected so as to remove said contaminant from the vicinity of said edges;
  (b) next, providing a mask to prevent etching within the vicinity of said edges, but not within the vicinity of the center of said holes by providing a gaseous plasma different from the gaseous plasma employed in step (a) being from a fluorinated compound and wherein the amounts of fluorinated compound are selected so as to form said mask in the vicinity of said edges; and
  (c) etching said holes in a gaseous plasma to remove contaminant from the interior in the vicinity of the center of said holes wherein said mask protects the vicinity of said edges from being etched and wherein said gaseous plasma is formed from oxygen and a fluorinated compound wherein the relative amounts of oxygen and said fluorinated compound are selected so as to cause etching in the vicinity of the center of said holes and are different from the gaseous plasma employed in step (b).

2. The process of claim 1 wherein the aspect ratio of said holes is at least about 3:1.

3. The process of claim 1 wherein the aspect ratio of said holes is at least about 9:1.

4. The process of claim 1 wherein the fluorinated compound is selected from the group of $CF_4$, $C_2F_6$, $CFCl_3$, $CF_3Cl$, $SF_6$, $NF_3$, and $CCl_2F_2$.

5. The process of claim 1 wherein said fluorinated compound is $CF_4$.

6. The process of claim 1 wherein said dielectric is epoxy.

7. The process of claim 6 wherein said fluorinated compound is selected from the group of $CF_4$, $C_2F_6$, $CFCl_3$, $CF_3Cl$, $SF_6$, $NF_3$, and $CCl_2F_2$.

8. The process of claim 6 wherein said fluorinated compound is $CF_4$.

9. The process of claim 6 wherein said fluorinated compound is $CF_4$ and the mole ratio of oxygen/$CF_4$ in steps (a) and (c) is 60 to 90/40 to 10; and the mole ratio of oxygen/$CF_4$ in step (b) is 0–45/100–55.

10. The process of claim 6 wherein the fluorinated compound is $CF_4$ and the mole ratio of oxygen/$CF_4$ in steps (a) and (c) is about 70/30.

11. The process of claim 10 wherein the mole ratio of oxygen/$CF_4$ in step (b) is about 40/60.

* * * * *

UNITED STATES PATENT AND TRADEMARK OFFICE
CERTIFICATE OF CORRECTION

PATENT NO. : 4,654,115

DATED : March 31, 1987

INVENTOR(S) : Egitto, et al.

It is certified that error appears in the above-identified patent and that said Letters Patent is hereby corrected as shown below:

Column 2, line 3, delete the word "form" and insert therefor the word -- from --.

Column 5, line 3 and bridging line 4, delete the word "minutes" and insert therefor the word -- minute --.

Signed and Sealed this

Twenty-seventh Day of October, 1987

Attest:

DONALD J. QUIGG

*Attesting Officer*      *Commissioner of Patents and Trademarks*